United States Patent [19]

Takahashi et al.

[11] Patent Number: 5,727,015
[45] Date of Patent: Mar. 10, 1998

[54] DISTRIBUTED FEEDBACK SEMICONDUCTOR LASER

[75] Inventors: Koji Takahashi, Tenri; Fumihiro Kounushi; Mototaka Taneya, both of Nara, all of Japan

[73] Assignee: Sharp Kabushiki Kaisha, Japan

[21] Appl. No.: 611,792

[22] Filed: Mar. 6, 1996

[30] Foreign Application Priority Data

Mar. 6, 1995 [JP] Japan ................. 7-045365

[51] Int. Cl.⁶ ............................................. H01S 3/1055
[52] U.S. Cl. ........................... 372/96; 372/46; 372/102
[58] Field of Search ............................ 372/96, 102, 46, 372/45

[56] References Cited

U.S. PATENT DOCUMENTS

| | | | |
|---|---|---|---|
| 4,606,033 | 8/1986 | Sakamoto | 372/45 |
| 4,716,570 | 12/1987 | Yoshida et al. | 372/46 |
| 5,289,494 | 2/1994 | Tada et al. | 372/96 |
| 5,325,392 | 6/1994 | Tohmori et al. | 372/96 |
| 5,361,271 | 11/1994 | Takiguchi et al. | 372/46 |
| 5,517,589 | 5/1996 | Takeuchi | 385/24 |
| 5,539,766 | 7/1996 | Ishino et al. | 372/96 |

FOREIGN PATENT DOCUMENTS

| | | | |
|---|---|---|---|
| 6339144 | 2/1988 | Japan | 350/162.11 |
| 6-7624 | 1/1994 | Japan | 372/96 |

OTHER PUBLICATIONS

David et al., "Coupling coefficients in gain-coupled DFB lasers: Inherent compromise between coupling strength and loss" *IEEE Photonics Technology Letters* (Feb. 1991) 3(5):439–441.

Luo et al., "Gain-coupled distributed feedback semiconductor lasers with an absorptive conduction-type inverted grating" *IEEE Photonic Technology Letters* (Feb. 1992) 4(7):692–695.

*Primary Examiner*—Rodney B. Bovernick
*Assistant Examiner*—Ellen E. Kang
*Attorney, Agent, or Firm*—Morrison & Foerster, LLP

[57] ABSTRACT

A gain coupled distributed feedback semiconductor laser includes an active layer and a diffraction grating provided in the vicinity of the active layer and having a plurality of light absorption layers periodically arranged along a resonator length direction. The order of the diffraction grating is one, a duty of the diffraction grating is in the range of about 0.4 to about 0.8, and a thickness of the light absorption layer is in the range of about 6 nm to about 30 nm.

8 Claims, 10 Drawing Sheets

DISTRIBUTED FEEDBACK SEMICONDUCTOR LASER

BACKGROUND OF THE INVENTION

1. Field of the Invention

The present invention relates to a gain coupled distributed feedback semiconductor laser (hereinafter, referred to as "gain coupled DFB-LD") of short wavelength which oscillates in a single longitudinal mode.

2. Description of the Related Art

A gain coupled DFB-LD has the following features (1) an excellent single longitudinal mode oscillation is obtained and (2) a noise due to returning light is less likely to occur. In particular, a so-called gain coupled DFB-LD of "short wavelength" having a wavelength shorter than about 1 μm plays an important role as a light source in an optical measuring apparatus, a high speed light transmission apparatus, and an optical recording apparatus.

A gain coupled DFB-LD has a double hetero-junction structure where an active layer which generates induced emission light is interposed between cladding layers which do not absorb the induced emission light. It also includes a diffraction grating in the vicinity of the active layer and has a mechanism in which distributed feedback of light results because of the periodic change in the gain of the induced emission light generated in the active layer by the diffraction grating and a laser oscillation subsequently results (referred to as "gain coupling").

There have been realized two methods as a method of periodically changing the gain of induced emission light by a diffraction grating. One is to periodically perturb the gain itself of the active layer (gain diffraction grating), and the other is to periodically form light absorption layers in the vicinity of the active layer so that an effective periodic perturbation on the gain results (absorption diffraction grating). With regard to the latter, the fundamental structure is illustrated in Japanese Patent Publication No. 6-7624, the research thereof being actively in progress.

Initially, a gain coupled DFB-LD having absorption diffraction grating had a problem that the induced emission light itself was lost due to absorption because of the introduction of periodic light absorption layers which were necessary for periodic perturbation on the gain to occur, thereby requiring more current than is usually necessary for a laser oscillation. That is, it experienced a contradicting phenomenon that if the periodic light absorption layers were excessively introduced in order to improve the single longitudinal mode oscillation characteristics, the laser oscillation efficiency was reduced because of light absorption by those periodic light absorption layers.

Figure 8:
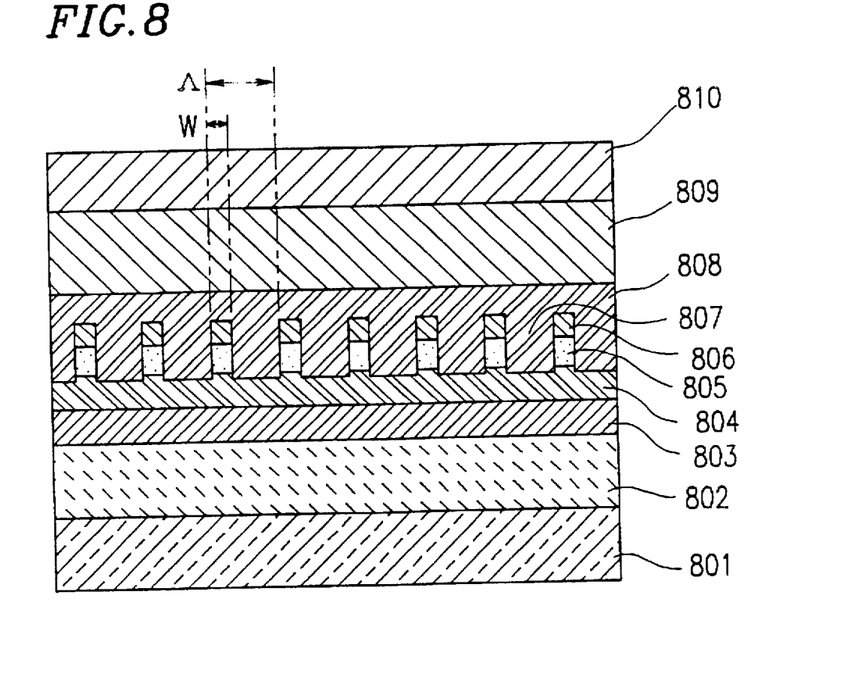
FIG. 8 is a view illustrating a conventional short wavelength gain coupled DFB-LD.

However, in regard to this problem, a concept that improvement of single longitudinal mode oscillation characteristics and reduction of loss of laser light can be simultaneously accomplished by introducing an absorption diffraction grating of smaller duty was indicated for the first time in IEEE PHOTONICS TECHNOLOGY LETTERS, VOL. 3, NO. 5 (1991), P. 439 (hereinafter, referred to as reference 1). Herein, the term "duty" means a ratio of the absorption region for each of the periods thereof (volume ratio) within a layer where the periodic absorption layer exits. In particular, in the case of a rectangular cross-section as shown in FIG. 8, if Λ denotes the length of one period of the diffraction grating and W the width of the light absorption layer in one period, the duty is the value given by $D=W/\Lambda$ ($0 \leq D \leq 1$). After the indication in reference 1, an absorption diffraction grating with a small duty has been used in a gain coupled DFB-LD having the absorption diffraction grating in a short wavelength region.

FIG. 8 is a view illustrating a structure of a conventional short wavelength gain coupled DFB-LD employing a structure where a periodic perturbation on the gain occurs effectively by forming a periodic light absorption layer in the vicinity of the active layer (from IEEE PHOTONICS TECHNOLOGY LETTERS, VOL. 4, NO. 7, 1992, P. 692). That is, an n-type $Al_{0.45}Ga_{0.55}As$ cladding layer 802 of 1.0 μm thickness, an undoped GaAs active layer 803 of 0.09 μm thickness, a p-type $Al_{0.45}Ga_{0.55}As$ carrier barrier layer 804 of 0.1 μm thickness, a p-type $Al_{0.3}Ga_{0.7}As$ first guide layer 805 of 0.1 μm thickness, and an n-type GaAs light absorption layer 806 of 50 nm thickness are successively crystal-grown on an n-type GaAs substrate 801 by metal organic chemical vapor deposition (MOCVD). Then a diffraction grating 807 is formed by double beam interference exposure and wet etching, and crystal growths of a p-type $Al_{0.25}Ga_{0.75}As$ second guide layer 808 of 0.1 μm thickness, a p-type $Al_{0.45}Ga_{0.55}As$ cladding layer 809 of 1.0 μm thickness, and a p-type GaAs contact layer 810 of 0.5 μm thickness are performed, thereby producing the device. The oscillation wavelength is 880 nm, and the order of the diffraction grating is three.

Also, in this example, the duty of the diffraction grating having a rectangular cross-section and defined by $D=W/\Lambda$ is within the range of values as small as 0.15 to 0.20 for production.

However, conventional distributed feedback semiconductor lasers varied greatly in device characteristics, and it was difficult to produce a device which has excellent repeatability of characteristics.

SUMMARY OF THE INVENTION

The gain coupled distributed feedback semiconductor laser of the present invention includes an active layer and a diffraction grating provided in the vicinity of the active layer and having a plurality of light absorption layers periodically arranged along a resonator length direction. The order of the diffraction grating is one, a duty of the diffraction grating is in the range of about 0.4 to about 0.8, and a thickness of the light absorption layer is in the range of about 6 nm to about 30 nm.

In one embodiment of the present invention, the effective duty of the diffraction grating is about 0.5.

In one embodiment of the present invention, a cross-sectional shape of the plurality of light absorption layers sectioned along a plane perpendicular to the active layer and parallel to the resonator length direction is rectangular.

In one embodiment of the present invention, a cross-sectional shape of the plurality of light absorption layers sectioned along a plane perpendicular to the active layer and parallel to the resonator length direction is triangular.

In one embodiment of the present invention, an effective forbidden band width of the light absorption layer is smaller than an effective forbidden band width of the active layer, and a difference between the effective forbidden band width of the light absorption layer and the effective forbidden band width of the active layer is about 0.126 eV or greater.

In one embodiment of the present invention, an effective forbidden band width of the light absorption layer is smaller than an effective forbidden band width of the active layer, and a difference between the effective forbidden band width of the light absorption layer and the effective forbidden band width of the active layer is about 0.126 eV or greater. The active layer and the light absorption layer are formed of $Al_xGa_{1-x}As$ and $Al_yGa_{1-y}As$, respectively, where $x-y \geq 0.1$.

In one embodiment of the present invention, a thickness of the light absorption layer is in the range of about 12 nm to about 20 nm.

Due to the above-mentioned construction, according to the gain coupled DFB-LD of the present invention, in the gain coupled DFB-LD having the periodic absorption layer for short wavelength using a conventional low-duty diffraction grating, an effect is obtained in that excellent single longitudinal mode characteristics and a sufficiently small absorption loss are obtained by using a first order absorption diffraction grating having a duty of about 0.4 to about 0.8 and a suitably controlled thin periodic absorption layer.

Also, a duty of about 0.5 most facilitates the production of the diffraction grating, having excellent reproducibility and controllability. Furthermore, in a case of a first order diffraction grating, although the duty fluctuates in the range of about 0.4 to about 0.8, the characteristics of the device are not greatly affected. That is, an effect for a gain coupled DFB-LD of short wavelength, a construction which has good reproducibility of device characteristics among devices or lots and is resistible to fluctuation among devices and lots is obtained.

Furthermore, according to the present invention, in a gain coupled DFB-LD having a periodic absorption layer, since the periodic absorption layer is made of a material such that an absorption coefficient of the periodic light absorption layer for induced emission light emitted from an active layer does not depend on an optical density, an impurity density, or a kind of impurity, a gain coupling constant due to the absorption diffraction grating becomes stabilized among devices and production lots, thereby improving the reproducibility of the device characteristics. Such an effect can be realized by using a semiconductor material whose effective forbidden band width is smaller than the active layer by about 0.126 eV or greater as the periodic light absorption layer.

Thus, the invention described herein makes possible the advantage of providing a distributed feedback semiconductor laser having high performance characteristics which are less likely to be affected by fluctuation due to the production processes of the device or by fluctuation related to the device structure.

These and other advantages of the present invention will become apparent to those skilled in the art upon reading and understanding the following detailed description with reference to the accompanying figures.

DESCRIPTION OF THE PREFERRED EMBODIMENTS

The inventors of the present application made the following study regarding poor reproducibility in a conventional distributed feedback semiconductor laser. In a gain coupled DFB-LD of short wavelength having a periodic absorption layer, the duty of the diffraction grating is controlled with great precision to a value as small as about 0.1 to 0.2 in order to achieve both the improvement of single longitudinal mode oscillation characteristics and reduction of loss of laser light, which was previously described as conventional art. However, since it is not easy to control the duty of the diffraction grating with great precision to a small value in double beam interference exposure (a diffraction grating pattern is obtained on a semiconductor substrate by copying an interference fringe of two laser beams on the photoresist), the reproducibility of the duty of the diffraction grating during production is not good. Therefore, it was predicted that a production yield of devices decreases due to the deterioration of the reproducibility of the duty of the diffraction grating, thereby deteriorating the reproducibility of device characteristics. It is not considered to be good, even in principle, with respect to device characteristics to produce the diffraction grating while controlling the duty in a range of 0.1 to 0.2, which makes production difficult, in spite of the fact that the value of the duty of the diffraction grating which most facilitates the production is 0.5. Therefore, it was concluded that it was necessary to realized a structure where the duty of the diffraction grating was easily controlled and where both improvement of the single longitudinal mode characteristics and reduction of loss of the laser light were simultaneously achieved. Also, in a conventional gain coupled DFB-LD having a periodic absorption layer, a semiconductor layer having a forbidden band width relatively close to the active layer has been used as the light absorption layer. In this case, the "absorption coefficient" which indicates the degree of absorption when the induced emission light is absorbed in the periodic absorption layer is strongly affected by fluctuation of the wavelength of the induced emission light (i.e., "light energy") due to a dopant impurity amount in the absorption layer, the kind of impurity, an optical density in the absorption layer, and the fluctuation of the composition of a mixed crystal active layer. This results in fluctuation of the device characteristics. It was also ascertained that the single longitudinal mode characteristics vary (decrease in many cases) due to a large change (a decrease in many cases) in the absorption coefficient of the light absorption layer by the output of the device when lased.

Figure 9A:
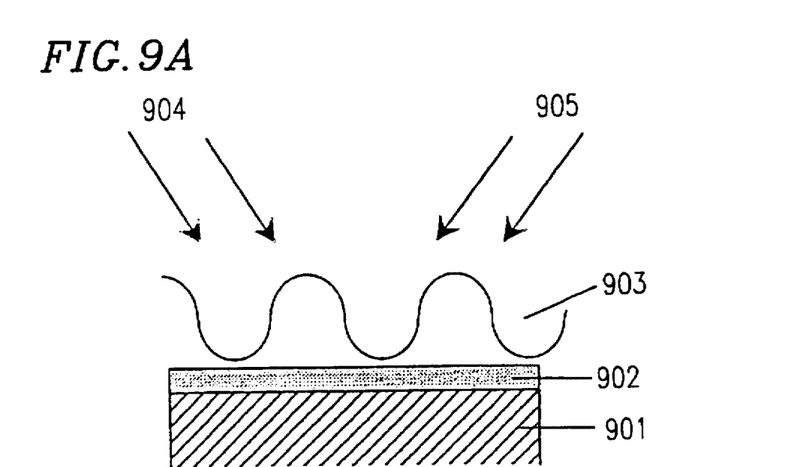
FIGS. 9A and 9B are views illustrating steps of producing a diffraction grating by double beam interference exposure.
Figure 9B:
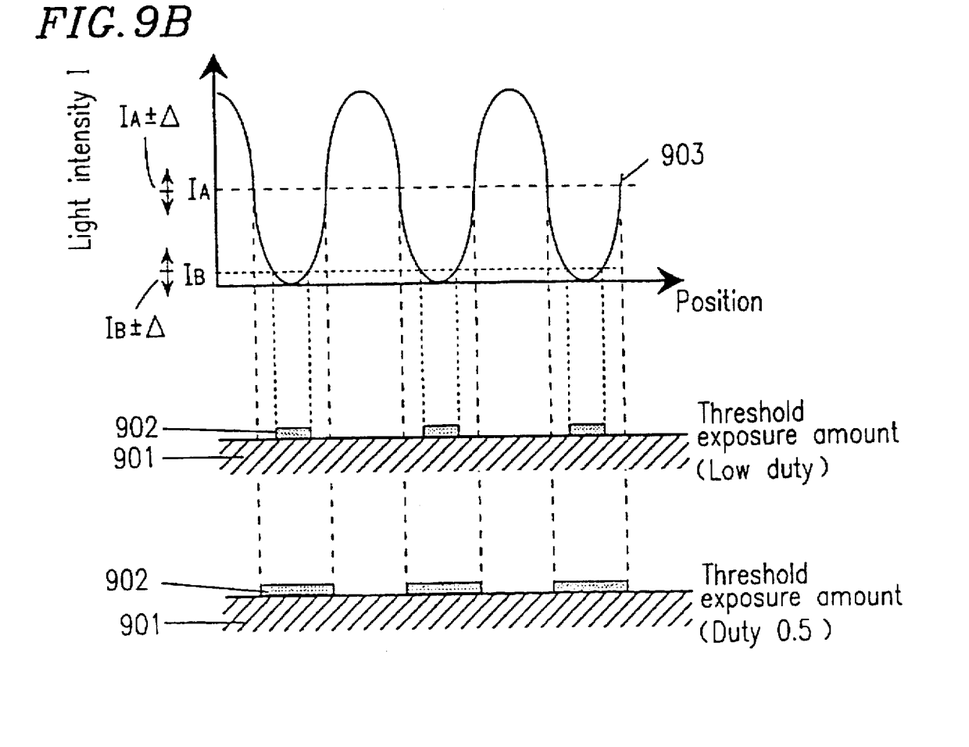

First, how the inventors of the present invention came to have this knowledge will be described. FIGS. 9A and 9B are conceptual diagrams of a double beam interference exposure. As shown in FIG. 9A, if a photoresist 902 formed on a semiconductor substrate 901 is irradiated with two laser beams illustrated as 904 and 905, periodic interference fringes having a sinusoidal distribution of the light intensity illustrated as 903 result. A pattern of a diffraction grating having periodic stripes can be copied on the semiconductor substrate 901 by exposing the photoresist with the above interference fringes. In a case where a positive type photoresist is exposed using the interference fringes, when a conventional diffraction grating of small duty is to be produced, a pattern of a diffraction grating having a small duty is obtained by exposure of the light intensity indicated as $I_B$ in FIG. 9B as the threshold exposure amount. On the other hand, if a pattern of a diffraction grating having a duty of 0.5 is to be obtained, the exposure of the light intensity $I_A$ as the threshold exposure amount is performed. The problem here is that the threshold exposure amount does not necessarily have a constant value all the time due to the daily changes or variation during processing in the resist sensitivity, or the like. As a result, the threshold exposure amounts such as $I_A$ and $I_B$ fluctuate within a range of $\pm\Delta$ around its value. If an exposure amount at the center of the sinusoidal light distribution is taken as the threshold exposure amount as with $I_A$, control becomes the easiest because this part is the threshold exposure amount for the highest contrast and also for the smallest ratio of the fluctuation in the resist width when $I_A$ fluctuates in the range of $\pm\Delta$. On the other hand, if a bottom part of the sinusoidal wave is taken as the threshold exposure amount as with $I_B$, the amount of fluctuation of the resist pattern when $I_B$ fluctuates in the range of $\pm\Delta$ becomes the largest. If $I_B$ fluctuates "downward (i.e., $I_B - \Delta$)" in FIG. 9B, there is a potential risk of the worst situation that the resist disappears completely. For these reasons, control becomes very difficult.

Therefore, in the present invention, the effective duty of the diffraction grating forming the periodic absorption layer can be controlled to be about 0.5. This is because the diffraction grating is most easily formed and, at the same time, the gain coupling results most strongly when the duty of the diffraction grating is about 0.5. Also, even if the effective duty of this periodic absorption layer fluctuates in the range of about 0.4 to about 0.8, if the center value or the average value of the effective duty among devices or lots is about 0.5, then since the effect of the fluctuation is small, devices having the same characteristics as those whose duty is controlled to be 0.5 can be obtained. A construction of the present invention differs in that the duty of the diffraction grating is about 0.5, not small conventional values of 0.1 to 0.2. The production of the diffraction grating, therefore, becomes facilitated and is industrially effective and practical.

However, in a case where a diffraction grating of the duty of 0.5 is used, the necessity of sufficiently optimizing the structure which simultaneously achieves improvement of the single longitudinal mode oscillation characteristics and reduction of loss of laser light arises. Here, a gain coupling constant $\kappa_g$ which is defined by the equation below is introduced as an indicator of the degree of single longitudinal oscillation characteristics (the larger the $\kappa_g$ is, the better the single longitudinal mode characteristics are), $$K_g = \frac{k_0^2}{2\beta} \Gamma_{abs} \frac{\alpha_{abs} n_{abs}}{\pi m k_0} \sin(\pi m D) \tag{1}$$

where $k_0$ is the number of waves in free space, $\beta$ is a transmission constant in z direction, $\alpha_{abs}$ is an absorption coefficient of the absorption layer, $n_{abs}$ is a refraction index of the absorption layer, m is the order of the diffraction grating, D is a duty of the diffraction grating, and $\Gamma_{abs}$ is a confinement coefficient of the portion having the periodic absorption layer given by $$\Gamma_{abs} = \frac{\int_{\text{periodic absorption layer}} E(x)E(x)^* \, dx}{\int_{-\infty}^{+\infty} E(x)E(x)^* \, dx} \approx P \cdot d_{abs} \tag{1'}$$

where x is in the direction perpendicular to the substrate,

E(x) is an electric intensity and E(x)* is the complex conjugate thereof,

P is a normalized average optical density within the periodic absorption layer, and $d_{abs}$ is a thickness of the light absorption layer, and an average absorption loss $\alpha_0$ due to the periodic absorption layer which is defined by the equation below is introduced as an indicator of the degree of the loss of the laser light (the smaller the $\alpha_0$ is, the smaller the loss of the laser light is), $$\alpha_0 = \Gamma_{abs} D \alpha_{abs} \tag{2}$$

Figure 10:
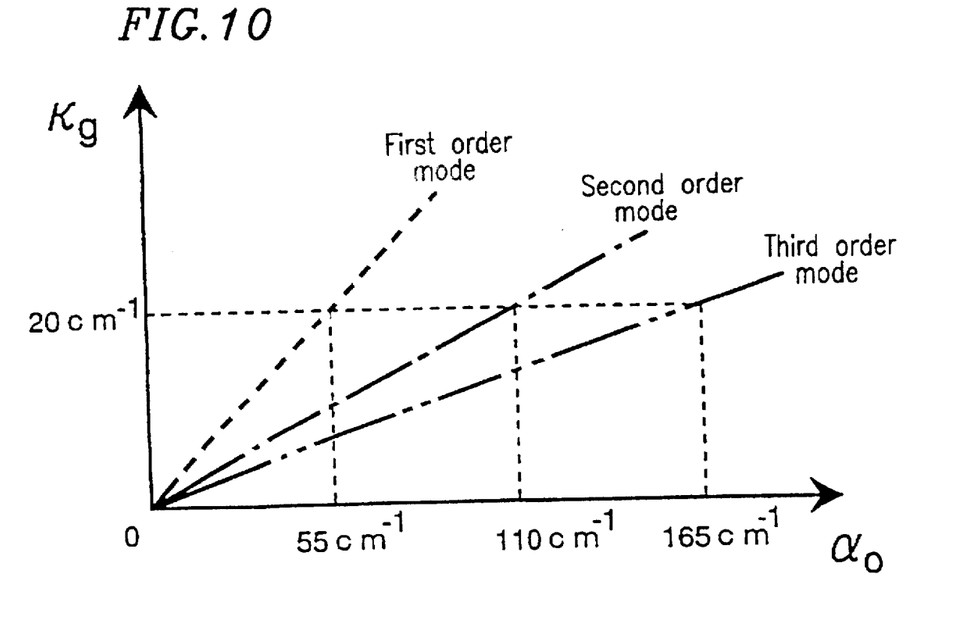
FIG. 10 is a graph illustrating a correlation between a gain coupling constant $\kappa_g$ and an average absorption loss $\alpha_0$ in diffraction gratings with differing orders.

There is a certain relationship illustrated in FIG. 10 between $\kappa_g$ representing the single longitudinal mode and $\alpha_0$ representing the loss (a duty of 0.5 of the diffraction grating and a rectangular shape of the diffraction grating are assumed in the figure). Referring to the order of the diffraction grating, the smaller that the order of the diffraction grating is, the smaller the $\alpha_0$ representing the loss can be made while increasing $\kappa_g$ representing the single longitudinal mode. Consequently, in order to have both improvement of the single longitudinal mode oscillation characteristics and reduction of loss of the laser light, a diffraction grating of the first order is most preferable. From equations (1) and (2), $\alpha_0$ monotonically increases with the thickness $d_{abs}$ of the periodic absorption layer, and consequently, the abscissa of FIG. 10 can be interpreted as representing the thickness $d_{abs}$ of the periodic absorption layer. In other words, it is understood that the thickness of the periodic absorption layer necessary to obtain a specific $\kappa_g$ (i.e., certain excellent single longitudinal mode characteristics) differs depending on the order of the diffraction grating; that the lower the order of the diffraction grating is, the thinner the absorption layer can be made; and that because of the absorption layer being thin, the loss $\alpha_0$ becomes sufficiently small. Therefore, by using a first order diffraction grating and a thin absorption layer, both of which constitute an embodiment of the present invention, an effect is obtained that "improvement of the single longitudinal mode oscillation characteristics" and "reduction of loss of the laser light" can simultaneously be achieved.

As to a thickness of this periodic absorption layer, the most suitable range was experimentally examined, and it was confirmed that by making the periodic absorption layer to be sufficiently thin in the range of about 6 to about 30 nm, the above-mentioned effect is achieved. If the thickness is less than about 6 nm, a sufficient $\kappa_g$ cannot be obtained even for a first order diffraction grating and the single longitudinal mode oscillation characteristics deteriorate, and if the thickness is more than about 30 nm, the loss $\alpha_0$ becomes too large and the current necessary for laser oscillation considerably increases; in either case, it is not suitable.

Hereinafter, a preferable example of the present invention will be described with reference to the attached figures.

Figure 1:
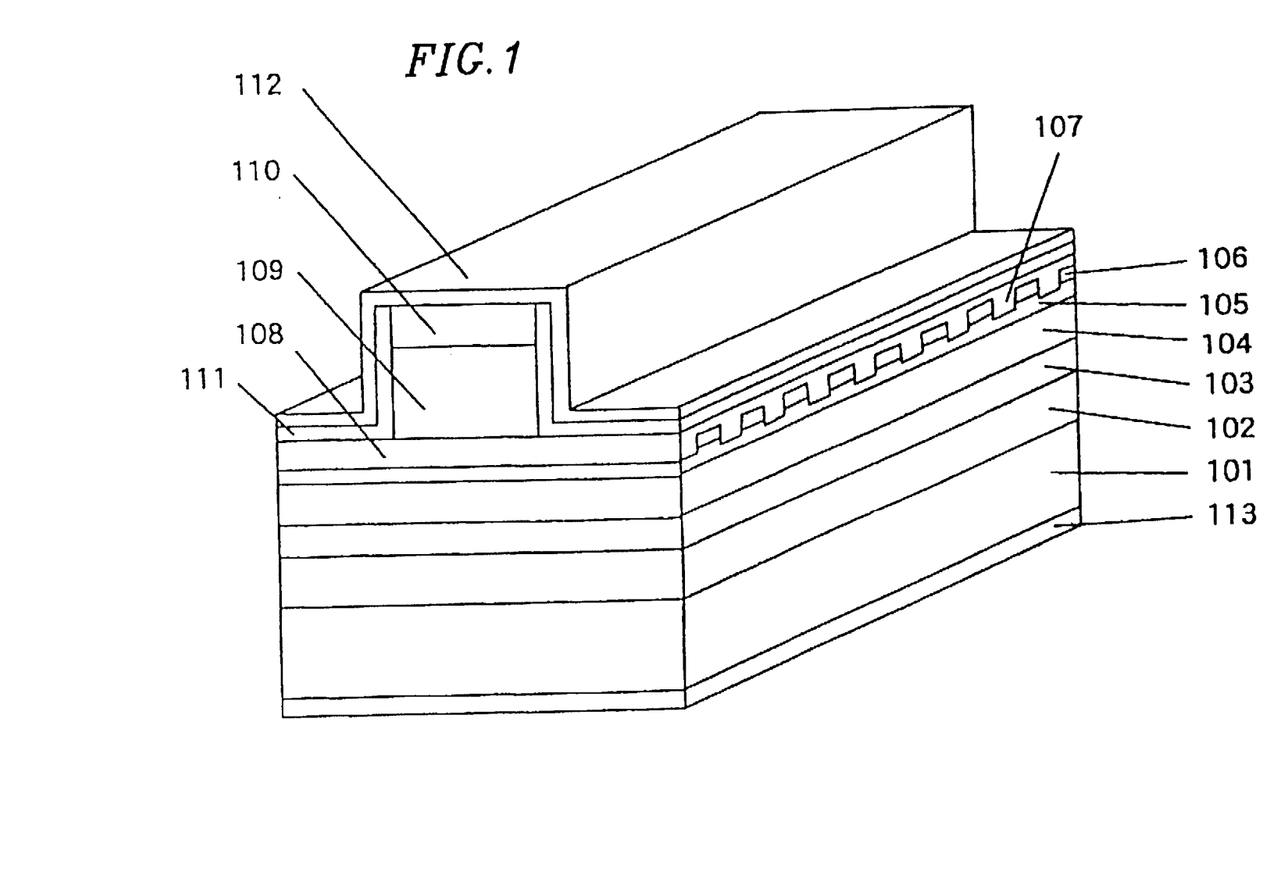
FIG. 1 is an isometric view illustrating a gain coupled DFB-LD of a first example of the invention.

FIG. 1 is an isometric view illustrating a structure of a gain coupled DFB-LD of a first example of the present invention. In this example, an n-type $Al_{0.6}Ga_{0.4}As$ cladding layer 102 of 1 μm thickness, an undoped $Al_{0.13}Ga_{0.87}As$ active layer 103 of 0.08 μm thickness, a p-type $Al_{0.05}Ga_{0.5}As$ carrier barrier layer 104 of 0.2 μm thickness, a p-type $Al_{0.25}Ga_{0.75}As$ first guide layer 105 of 0.058 μm thickness, and an n-type GaAs light absorption layer 106 of 12 nm thickness are formed on an n-type GaAs substrate 101 in this order by a first epitaxial growth using metal organic chemical vapor deposition (MOCVD). Next, a diluted positive type resist is applied to a thickness of 50 nm onto the light absorption layer 106 which is the highest layer of the grown layers, and then a resist mask having a pitch of 0.11 μm is formed by double beam interference exposure through the use of a prism having a refraction index of 1.54. Next, a rectangular shape diffraction grating 107 having a depth of 0.03 μm is formed by wet etching using a mixture of hydrochloric acid/hydrogen peroxide/pure water. This rectangular diffraction grating has a plurality of absorption layers 106 periodically arranged along a resonator length direction. In this case, the duty of the diffraction grating is about 0.5. The rectangular shape of the diffraction grating means that the cross-sectional shape of the absorption layers 106 sectioned along a plane perpendicular to the active layer 103 and parallel to the resonator length direction is rectangular. Next, a p-type $Al_{0.25}Ga_{0.75}As$ second guide layer 108 of 0.03 μm thickness, a p-type $Al_{0.75}Ga_{0.25}As$ upper cladding layer 109 of 0.8 μm thickness, and a $p^+$-type GaAs contact layer 110 of 0.5 μm thickness are formed thereon in this order by a second epitaxial growth. By first growing $Al_xGa_{1-x}As$ with a mixed crystal ratio x=0.3 or less on the uneven surface of the diffraction grating in the second epitaxial growth, the diffraction grating is buried flat, thereby improving the crystillinity of the upper cladding layer growing thereon.

Next, a resist mask of a stripe shape having 3 μm width is formed by using photolithography, and a $p^+$-type GaAs contact layer 110 and a p-type $Al_{0.75}Ga_{0.25}As$ upper cladding layer 109 are partially removed by wet etching, leaving a stripe-shaped portion thereof of a width of 3 μm. By using the surface of the second guide layer 108 as an etching stopper layer, a ridge structure can be formed with excellent controllability for depth. After the ridge formation, an insulating film 111 made of silicon nitride of about 0.2 μm thickness is formed on the entire surface by plasma CVD, and then only the portion thereof on the ridge is removed by etching. Finally, the rear surface of the substrate 101 is thinned to about 100 μm, and electrodes 112 and 113 are formed on the front and rear surfaces, respectively, by vacuum evaporation, thereby completing the device.

It was observed that the device thus produced exhibited a single longitudinal mode oscillation in a temperature range of 0° to about 100° C. At room temperature, the threshold current and the efficiency were 30 mA and 0.35 W/A, respectively, for the device's total length of 250 μm.

In the construction of the present invention, the $\kappa_g$ was 20 $cm^{-1}$ which was sufficiently large for a gain coupled DFB-LD exhibiting single longitudinal mode oscillation to function, and the $\alpha_0$ was 55 $cm^{-1}$ which was small enough to make the oscillation threshold current sufficiently small.

Figure 2:
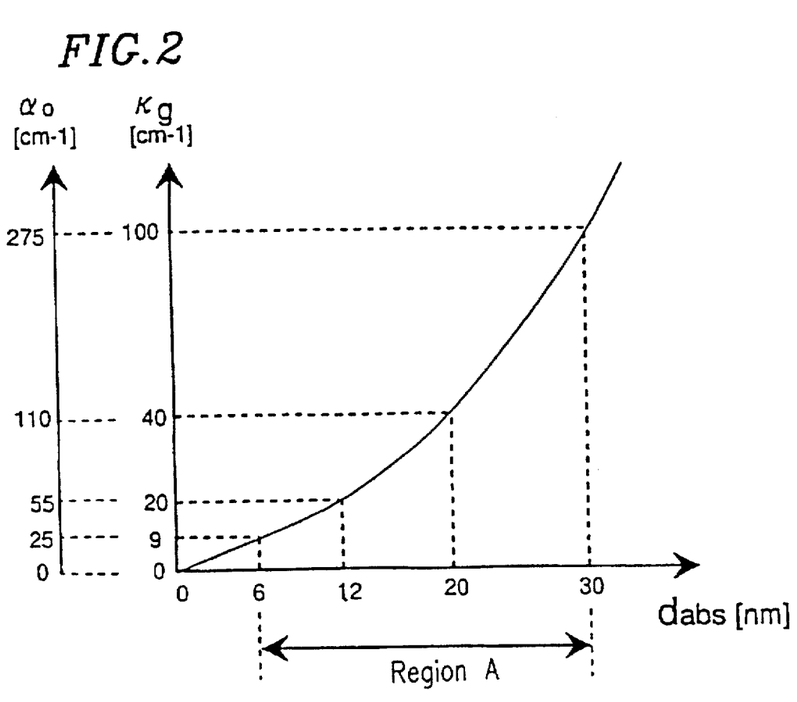
FIG. 2 is a graph illustrating a correlation between the thickness of the periodic absorption layer and the gain coupling constant $\kappa_g$ and average absorption loss $\alpha_0$, respectively.

Device structures are prepared using the device structure shown in FIG. 1 but only a thickness of $d_{abs}$ of the absorption layer 106 is changed as a parameter, and the $\kappa_g$ and $\alpha_0$ thereof were estimated, the results of which are shown in FIG. 2. Both $\kappa_g$ and $\alpha_0$ monotonically increase as $d_{abs}$ increases. For devices whose $d_{abs}$ is less than 6 nm, that is, whose $\kappa_g$ is less than 9 $cm^{-1}$, single longitudinal mode oscillation could not be obtained, revealing that $d_{abs}$ had to be at least about 6 nm or more. On the other hand, for devices whose $d_{abs}$ is greater than about 30 nm, that is, whose $\alpha_0$ exceeds 275 $cm^{-1}$, the oscillation threshold current exceeded 500 mA and the efficiency stayed at a low value below 0.01 W/A, thereby notably increasing the operating power for no practical use. Consequently, it was revealed that $d_{abs}$ had to be 30 nm or less. Therefore, if $d_{abs}$ is in the range of about 6 to about 30 nm (the most suitable region A shown in FIG. 2), although the absorption diffraction grating is very thin, $\kappa_g$ can take a large value since it is the first order diffraction grating. And, since the absorption layer is thin, the loss $\alpha_0$ can be reduced and a structure which can operate with small current can be realized. As the optimized value, it is desirable that $\kappa_g$ be 20 $cm^{-1}$ or more and $\alpha_0$ be 110 $cm^{-1}$ or less. Consequently, it follows that a preferable range for $d_{abs}$ be about 12 to about 20 nm.

Figure 3A:
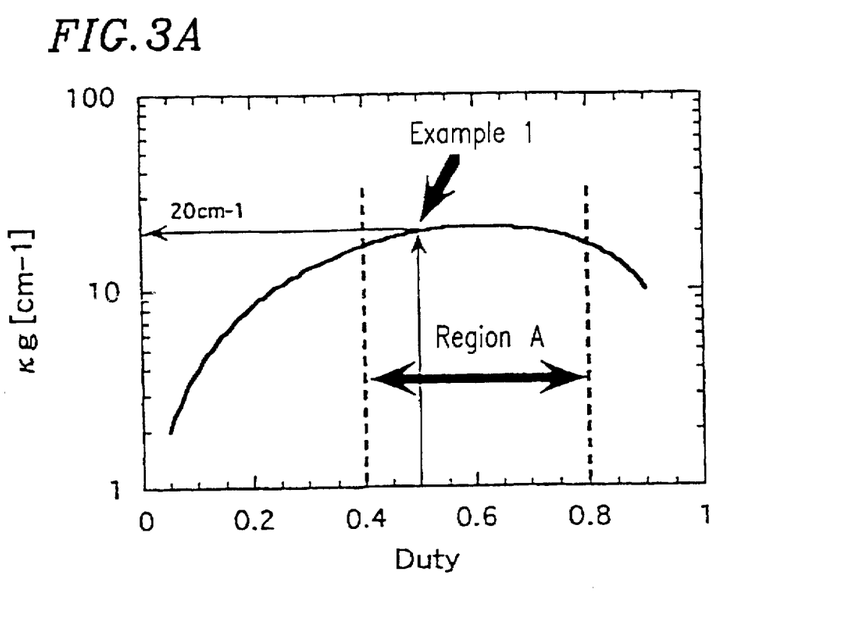
FIG. 3A is a graph illustrating a correlation between the duty of a first order diffraction grating and a gain coupling constant $\kappa_g$ in a gain coupled DFB-LD of a first example of the invention.
Figure 3B:
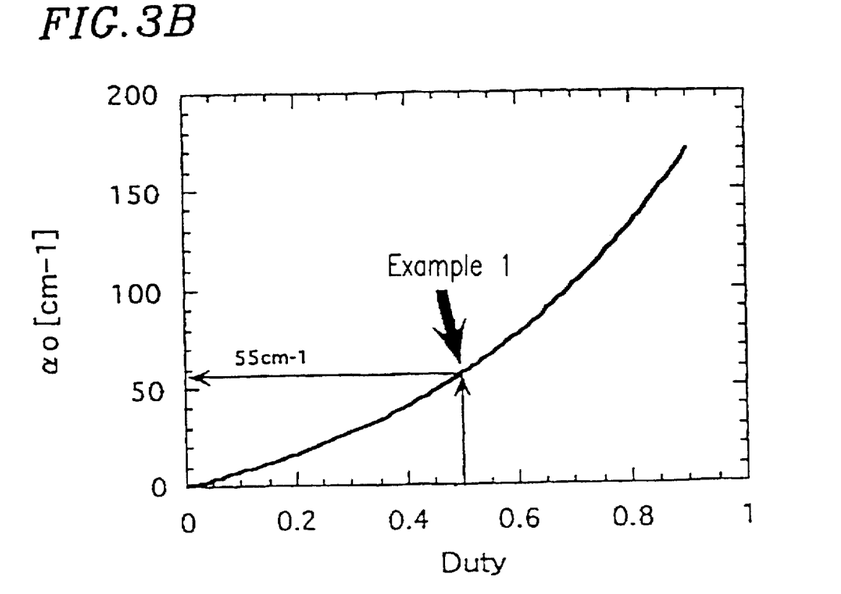
FIG. 3B is a graph illustrating a correlation between the duty of a first order diffraction grating and an average absorption loss $\alpha_0$ in the gain coupled DFB-LD of a first example of the invention.

In FIG. 3A, the change in the $\kappa_g$ of the device which has the construction illustrated in FIG. 1 and whose duty of the produced diffraction grating is changed from the targeted value of 0.5 because of the fluctuation of the threshold exposure amount during the fabrication of the diffraction grating by the double beam interference exposure. In FIG. 3B, the change in the $\alpha_0$ of the device which has the construction illustrated in FIG. 1 and whose duty of the produced diffraction grating is changed from the targeted value of 0.5 because of the fluctuation of the threshold exposure amount during the fabrication of the diffraction grating by the double beam interference exposure. The duty of the diffraction grating was 0.5 in the present invention. However, even if it fluctuates in a range of about 0.4 to about 0.8, 80% or above of the targeted value for $\kappa_g$ is ensured (20 $cm^{-1}$ for a duty of 0.5), which is sufficient for the gain coupled DFB-LD having designed characteristics to function. In FIG. 3A, a practical region where $\kappa_g$ is sufficiently large and $\alpha_0$ is sufficiently small is illustrated as region A. This results in the indication that in the present invention, the duty of the diffraction grating is around 0.5 which facilitates the fabrication, and that for the device to be produced, the fluctuation of the duty in the range of about 0.4 to about 0.8 is permitted and the requirement toward controllability is thus lessened. That is, because preparation is easily made with less fluctuation and because an acceptance range for the fluctuation due to device structures is wide, the construction has excellent reproducibility. Although the conductivity type of the light absorption layer 106 is opposite to those of layers in the vicinity thereof in the present invention, the effect is the same even if the conductivity type are the same as those of layers in the vicinity thereof. Also, as can be seen from FIG. 4B, $\alpha_0$ is 55 $cm^{-1}$, which is sufficiently small for the duty of 0.5 (value in the example).

Figure 4A:
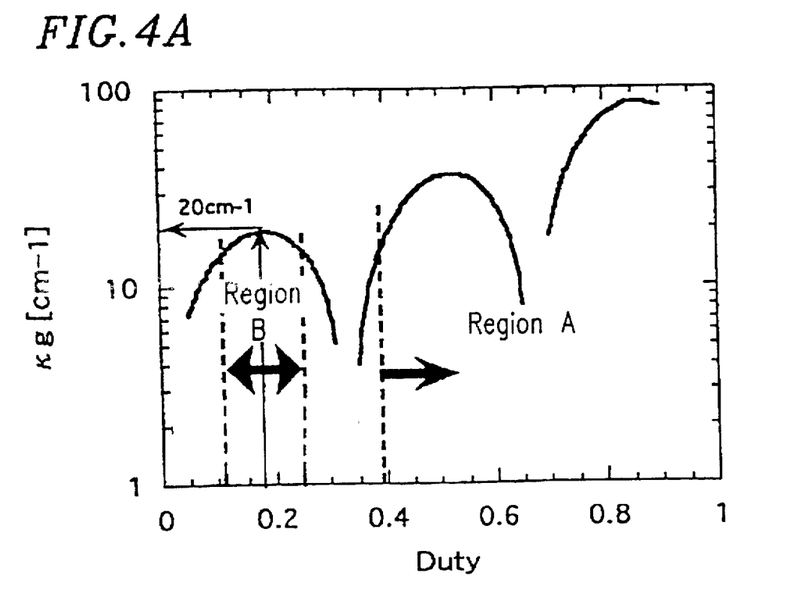
FIG. 4A is a graph illustrating a correlation between the duty of a third order diffraction grating and a gain coupling constant $\kappa_g$ in the gain coupled DFB-LD of a first example of the invention.
Figure 4B:
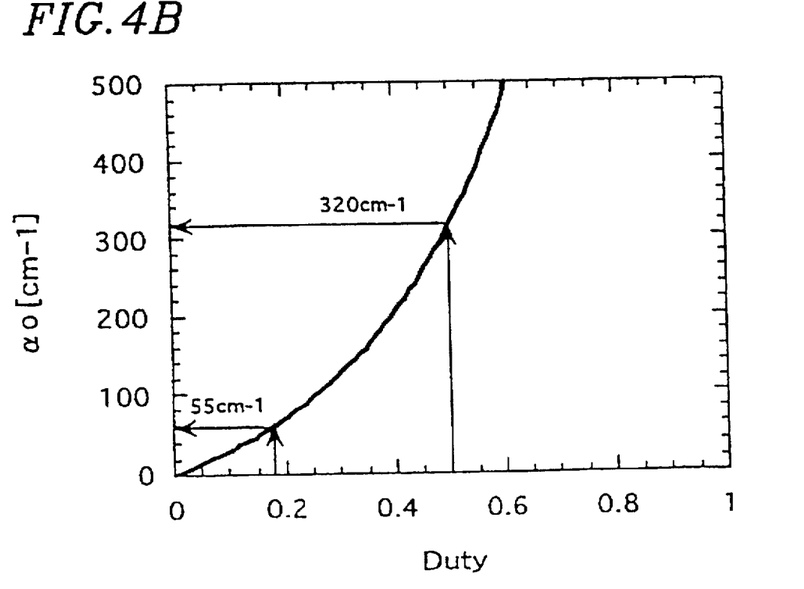
FIG. 4B is a graph illustrating a correlation between the duty of the third order diffraction grating and an average absorption loss $\alpha_0$ in the gain coupled DFB-LD of a first example of the invention.

In a case that a third order diffraction grating found in the conventional example is applied to a device having the same construction as that shown in FIG. 1 while keeping the rest of the construction intact, it is necessary to increase the thickness of the absorption layer to 0.06 μm in order to gain $\kappa_g$. The correlation between the duty of the diffraction grating and the $\kappa_g$ in the case that a third order diffraction grating having an absorption layer of 0.06 μm thickness is shown in FIG. 4A. The correlation between the duty of the diffraction grating and the $\alpha_0$ in the case where the third order diffraction grating having an absorption layer of 0.06 μm thickness is shown in FIG. 4B. Since the absorption layer is thick, the influence of the excessive $\alpha_0$ is great, and the $\alpha_0$ reaches 320 cm$^{-1}$ for a duty of 0.5 of the diffraction grating, which is considered to most facilitate the production as shown in FIG. 4B. Consequently, it cannot practically be used. Hence, it is necessary to bring the duty into the vicinity of 0.2. The duty of 0.2 is the same as in the conventional construction, and $\alpha_0$ is then about 55 cm$^{-1}$. That is, in region B with a duty of 0.4 or greater as shown in FIG. 4A, $\alpha_0$ becomes too large to be used. Therefore, it is necessary to have a low-duty construction which keeps the duty in the vicinity of 0.1 to 0.3 in order to keep $\alpha_0$ low (having the same construction as a conventional device in region B in FIG. 4A). In this case, it is necessary to control the duty to a range of 0.12 to 0.25 in order to ensure 80% or more of the targeted $\kappa_g$ value (20 cm$^{-1}$ for the duty of 0.175). In particular, there exits a point where $\kappa_g$ falls down to zero in the vicinity of the duty of 0.33, and demands toward the controllability of production processes become severe. Accordingly, reproducibility becomes difficult to achieve, thereby resulting in a device construction which is susceptible to the fluctuation of the duty of the diffraction grating among devices or production lots.

However, as to the combination of the active layer and the light absorption layer, the material for the active layer is $Al_{0.14}Ga_{0.86}As$ and the material for the light absorption layer is GaAs, and the difference in the forbidden band width between the active layer and the light absorption layer is as large as 0.166 eV. As a result, the absorption coefficient of the periodic light absorption layer was stabilized, and excellent single longitudinal mode characteristics were obtained with good repeatability. This will be described in detail with reference to FIGS. 5A and 5B.

Figure 5A:
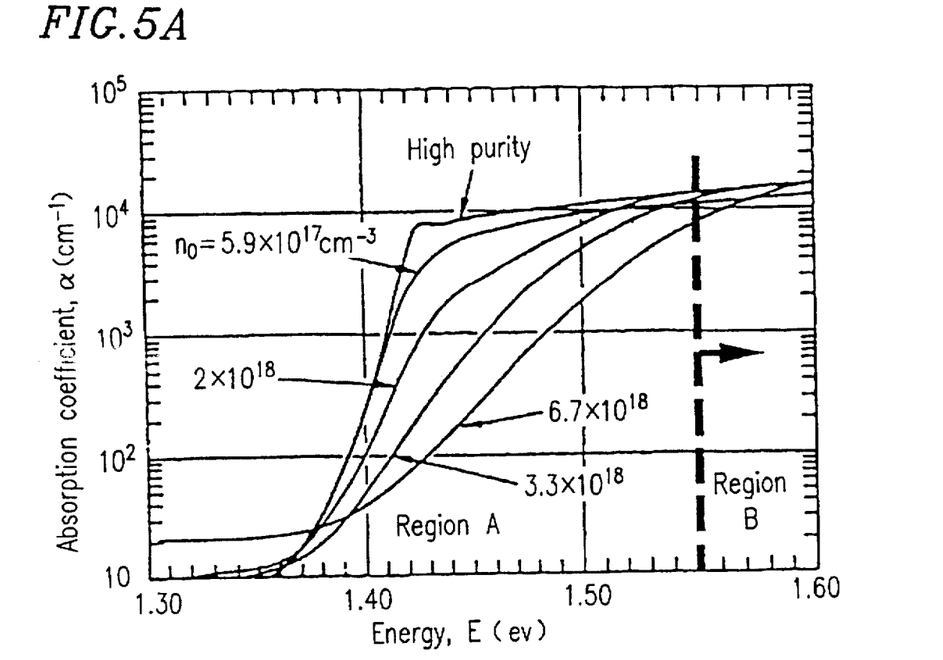
FIG. 5A is a graph illustrating a light energy dependence of an absorption Coefficient of an n-type GaAs.
Figure 5B:
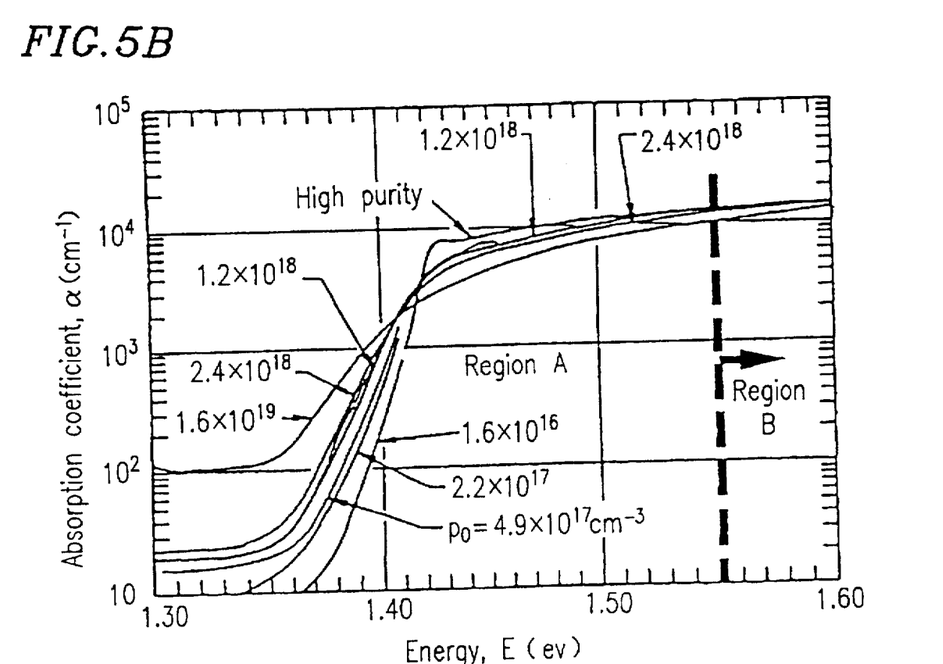
FIG. 5B is a graph illustrating a light energy dependence of an absorption coefficient of a p-type GaAs.

The light energy dependance of an absorption coefficient for an n-type GaAs and a p-type GaAs is shown in FIGS. 5A and 5B, respectively. For a semiconductor laser, the density of a dopant impurity to be added is controlled to be around $5 \times 10^{17}$ to $2 \times 10^{18}$ cm$^{-3}$. With regard to GaAs in this range, regardless of whether it is n-type or it is p-type, the absorption coefficient of the GaAs largely depends on the density of the dopant impurity to be contained therein for the light energy of 1.55 eV or less, and a stable absorption coefficient is not ensured (region A in FIGS. 5A and 5B). Furthermore, since the absorption coefficient of GaAs depends largely on the light energy for light energy of 1.55 eV or less, when the mixed crystal ratio of the active layer which is made of a mixed crystal of semiconductors fluctuates among devices or production lots, the energy of the induced emission light emitted from the active layer (i.e., the wavelength) fluctuates and, as a result, the absorption coefficient of the periodic absorption layer fluctuates among devices or production lots, thereby creating a problem of reproducibility of device characteristics. On the other hand, for light having light energy of 1.55 eV or more, the absorption coefficient of the GaAs does not depend on either the impurity density or the light energy but takes a large and almost constant value of about 12000 to about 15000 cm$^{-1}$, thereby achieving a construction which excels in reproducibility in device production and in stability in device operation (region B in FIGS. 5A and 5B). Since the forbidden band width of GaAs is 1.424 eV, it follows that if the difference in the forbidden band width between the active layer and the absorption layer is about 0.126 eV or more, then the above-mentioned effect can be expected. Not only in GaAs but also in other material systems including (Al, Ga, In)(P, As, N), (Zn, Mg, Cd)(S, Se) or the like, if the difference in the forbidden band width between the active layer and the light absorption layer is 0.126 eV or more, then a similar effect results. When at least one of the active layer and light absorption layer is of a quantum well structure, since the above argument holds by taking the transition energy between quantum levels having the least energy as the effective forbidden band width, the active layer and the light absorption layer may be of a quantum well structure. Moreover, as in the present example, in a material of the $Al_xGa_{1-x}As$ type in which a forbidden band width can freely be selected while maintaining the lattice constant by changing the mixed crystal ratio of Al, the condition that the difference x−y in the mixed crystal ratio between the active layer $Al_xGa_{1-x}As$ and the periodic light absorption layer $Al_yGa_{1-y}As$ is 0.1 or above becomes the condition that the difference in the forbidden band width is 0.126 eV or above, corresponding to the condition of a stable absorption coefficient. Although the conductivity type of the light absorption layer 106 is opposite to those of layers in the vicinity thereof in the present invention, the same effect as above is obtained even if the conductivity type is the same as those of layers in the vicinity thereof.

Figure 6:
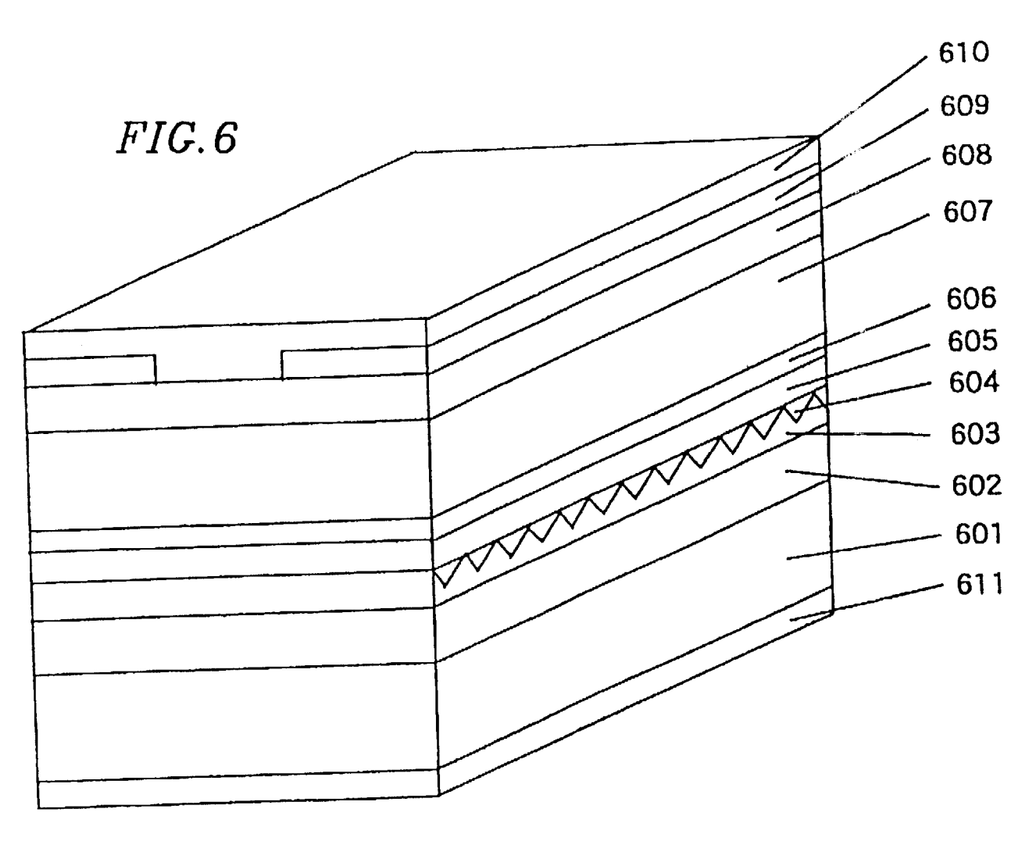
FIG. 6 is an isometric view illustrating a gain coupled DFB-LD of a second example of the invention.
Figure 7A:
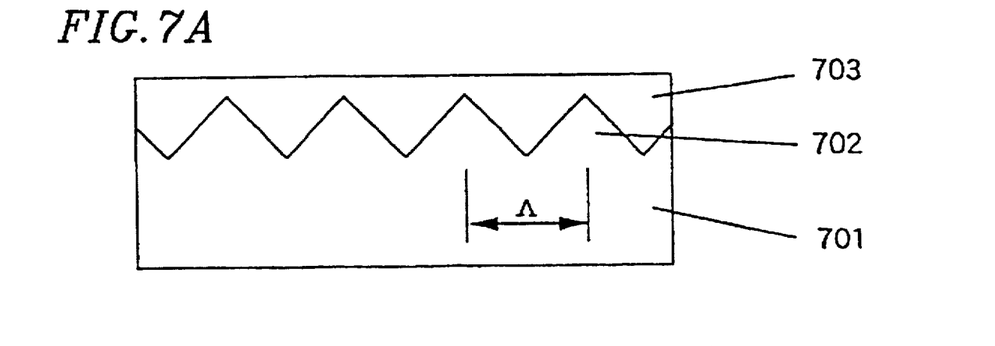
FIGS. 7A–7D are views illustrating a method of producing a first order diffraction grating in the gain coupled DFB-LD of a second example of the invention.
Figure 7B:
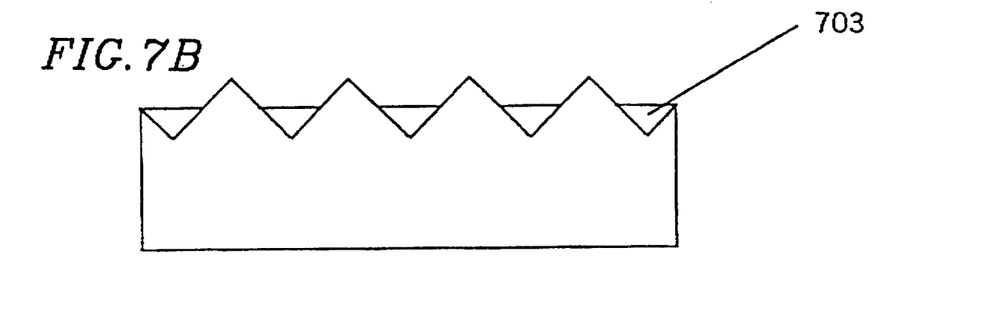
Figure 7C:
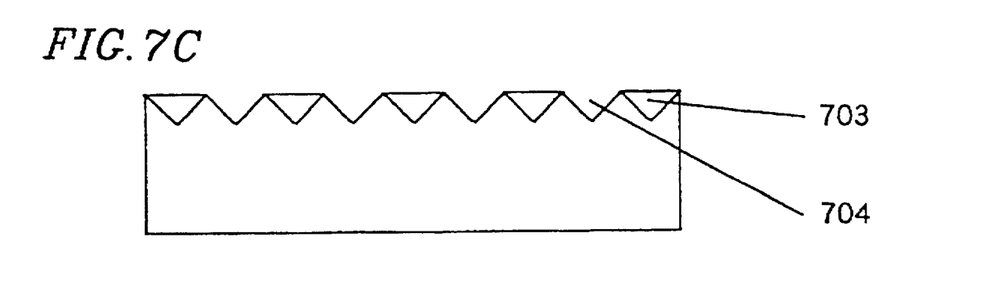
Figure 7D:
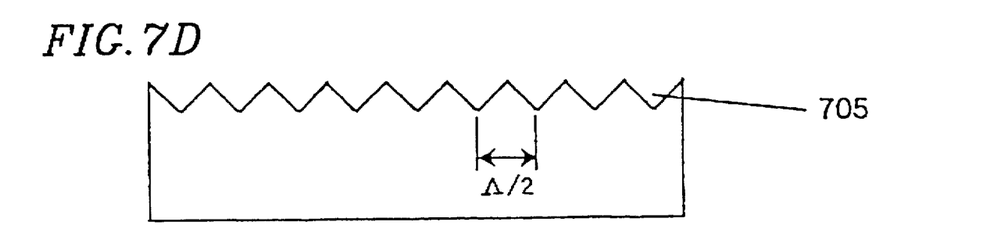

FIG. 6 is an isometric view illustrating a construction of a gain coupled DFB-LD of a second example of the present invention. In this example, first, an n-type $Al_{0.55}Ga_{0.45}As$ first lower cladding layer 602 of 1.0 μm thickness and an $Al_{0.25}Ga_{0.75}As$ guide layer 603 of 0.1 μm thickness are formed on an n-type GaAs substrate 601 by a first epitaxial growth by metal organic chemical vapor deposition (MOCVD). Then a second order triangular diffraction grating (having a pitch of about 0.24 μm) is formed on the guide layer 603 which is the highest layer among the growth layers by double beam interference exposure in air and wet etching. Next, as shown in FIG. 7A, a photoresist 703 is formed on a second order triangular diffraction grating 702 and then immersed in the developer. Then using the thickness reduction phenomenon of the unsensitized portion of the resist, the etching surface of the diffraction grating is partly exposed as shown in FIG. 7B, and then a portion of a diffraction grating 704 is etched by a second wet etching as shown in FIG. 7C. Consequently, as shown in FIG. 7D, a diffraction grating 705 having about 33 nm depth and a periodicity half of that of the diffraction grating shown in FIG. 7A, i.e., a first order periodicity (about 0.12 μm pitch) is obtained.

An n-type GaAs light absorption layer 604 of 30 nm thickness is grown on the diffraction grating by a second epitaxial growth. During this second epitaxial growth, the light absorption layer 604 is crystal-grown only in the valley of the triangular diffraction grating as seen in FIG. 6. The absorption diffraction grating by the light absorption layer then becomes triangular. The triangular diffraction grating means that a cross-sectional shape of the light absorption layer 604 sectioned along a plane perpendicular to the active layer 606 and parallel to the resonator length direction is triangular. If the ratio (volume ratio) of the absorption region of each period within the layer in which the periodic absorption layer exits is regarded as the effective duty D ($0 \leq D \leq 1$), then D is generally to be given by equation (3) below.

$$D = \frac{\begin{pmatrix} \text{sum of volumes of the light absorption} \\ \text{layers in the layer where the} \\ \text{light absorption layers exist} \end{pmatrix}}{\begin{pmatrix} \text{volume of the layer where the light} \\ \text{absorption layer exist} \end{pmatrix}} \quad (3)$$

$$= \frac{\int_{\text{period absorption layer}} D(x)dx}{\int_{\text{periodic absorption layer}} dx}$$

where x is in the direction perpendicular to the substrate and D is a duty of the absorptive diffraction grating at position x.

The effective duty D of the absorption diffraction grating of the present example was about 0.4. The duty of the absorption diffraction grating is thus defined for a shape other than a rectangle as discussed above. The subject of the present invention is to substantially control the effective duty given by Equation (3) to be within a range of about 0.4 to about 0.8, and it is not limited by the shape of the absorption diffraction grating.

Next, an n-type $Al_{0.45}Ga_{0.55}As$ second lower cladding layer 605 of 0.1 µm thickness, a multiquantum well active layer 606 made of undoped $GaAs/Al_{0.2}Ga_{0.8}As$, a p-type $Al_{0.5}Ga_{0.5}As$ upper cladding layer 607 of 1.5 µm thickness, and a p⁺-type GaAs contact layer 608 of 0.5 µm thickness are successively formed on the light absorption layer 604 by a second epitaxial growth.

Next, an insulating film 609 having 0.2 µm thickness and made of silicon oxide is formed on the entire surface by electron beam vapor deposition, and then the insulating film is removed by photolithography and wet etching to leave a region of stripe shape having 10 µm width. Finally, the rear surface of the substrate 601 is thinned to about 100 µm thickness, and electrodes 610 and 611 are formed on the front and rear surfaces, respectively, by vacuum vapor deposition, thereby completing the device.

A single longitudinal mode oscillation having an oscillation wavelength of 800 µm was observed in a temperature range of 0° to 80° C. for the device. The threshold current at room temperature is 150 mA, and a laser oscillation at a sufficiently low threshold current was obtained due to the effect of employing the first order absorption diffraction grating.

In the construction of the present example, $\kappa_g$ is 40 cm⁻¹ which is sufficiently large enough to operate as a gain coupled DFB-LD generating a single longitudinal mode oscillation, and $\alpha_0$ is 110 cm⁻¹ which makes the oscillation threshold current sufficiently small.

As to the combination of the active layer and the light absorption layer, a material for the active layer was multiquantum well of $GaAs/Al_{0.2}Ga_{0.8}As$ and a material for the light absorption layer was GaAs, and the difference between the lowest quantum level of the active layer and the forbidden band width of the light absorption layer was as large as 0.126 eV. As a result, the absorption coefficient of the periodic light absorption layer became stabilized and excellent single longitudinal mode characteristics were obtained with good repeatability.

In the above examples, although only those which are made of AlGaAs are illustrated, as long as it is a gain coupled DFB-LD having a structure where the absorption coefficient periodically changes, the material system thereof is not limited to those described in the above examples, but the present invention can be applied to other material systems such as those containing (Al, Ga, In)(P, As, N) or (Zn, Mg, Cd)(S, Se). Furthermore, there is no limitation to the shape or the production method of the striped region along the light transmitting region.

The present invention can also be applied to a structure where the periods of the perturbation of the refraction index and the perturbation of the gain (loss) are the same and the phases are shifted, or to a structure where the periodic light absorption layer is disposed outside of the stripe-shaped region along the light transmitting region.

According to a distributed feedback semiconductor laser of claims 1, 2, and 7, excellent single longitudinal mode characteristics and a sufficiently small absorption loss can be obtained, and it becomes possible to provide a distributed feedback semiconductor laser which excels in controllability and reproducibility.

According to a distributed feedback semiconductor laser of claims 3 and 4, a gain coupling can be obtained most strongly among a first order diffraction gratings, and it becomes possible to provide a distributed feedback semiconductor laser having better light emission efficiency.

According to a distributed feedback semiconductor laser of claim 5, the absorption coefficient of the periodic light absorption layer for the induced emission light emitted from the active layer does not depend on the optical density, optical energy, or the impurity density within the periodic absorption layer. As a result, the gain coupling constant due to the periodic absorption layer becomes stable among devices or production lots, thereby improving the reproducibility of device characteristics.

According to a distributed feedback semiconductor laser of claim 6, the absorption coefficient of the periodic light absorption layer for the induced emission light emitted from the active layer does not depend the on optical density, optical energy, or the impurity density within the periodic absorption layer, and at the same time, the reproducibility of device characteristics is improved without taking coordination for a lattice constant into consideration.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A gain coupled distributed feedback semiconductor laser, comprising:
   an active layer; and
   a diffraction grating provided in the vicinity of said active layer and having a plurality of light absorption layers periodically arranged along a resonator length direction,
   wherein the order of said diffraction grating is one, a duty of said diffraction grating is in the range of about 0.4 to about 0.8, and a thickness of said light absorption layer is in the range of about 6 nm to about 30 nm.

2. A distributed feedback semiconductor laser according to claim 1, wherein the effective duty of said diffraction grating is about 0.5.

3. A distributed feedback semiconductor laser according to claim 1, wherein a cross-sectional shape of said plurality of light absorption layers sectioned along a plane perpendicular to said active layer and parallel to said resonator length direction is rectangular.

4. A distributed feedback semiconductor laser according to claim 1, wherein a cross-sectional shape of said plurality of light absorption layers sectioned along a plane perpendicular to said active layer and parallel to said resonator length direction is triangular.

5. A distributed feedback semiconductor laser according to claim 1, wherein an effective forbidden band width of said light absorption layer is smaller than an effective forbidden band width of said active layer, and a difference between the effective forbidden band width of said light absorption layer and the effective forbidden band width of said active layer is about 0.126 eV or greater.

6. A distributed feedback semiconductor laser according to claim 1, wherein an effective forbidden band width of said light absorption layer is smaller than an effective forbidden band width of said active layer, and a difference between the effective forbidden band width of said light absorption layer and the effective forbidden band width of said active layer is about 0.126 eV or greater, and said active layer is formed of $Al_xGa_{1-x}As$, said light absorption layer is formed of $Al_yGa_{1-y}As$, and $x-y \geq 0.1$.

7. A distributed feedback semiconductor laser according to claim 1, wherein a thickness of said light absorption layer is in the range of about 12 nm to about 20 nm.

8. A gain coupled distributed feedback semiconductor laser oscillating at a wavelength shorter than about 1 μm comprising:

an active layer; and a diffraction grating provided in the vicinity of said active layer and having a plurality of light absorption layers periodically arranged along a resonator length direction, wherein the order of said diffraction grating is one, a duty of said diffraction grating is in the range of about 0.4 to about 0.8, and a thickness of said light absorption layer is in the range of about 6 nm to about 30 nm.

* * * * *